US006777317B2

United States Patent
Seibel et al.

(10) Patent No.: US 6,777,317 B2
(45) Date of Patent: Aug. 17, 2004

(54) METHOD FOR SEMICONDUCTOR GATE DOPING

(75) Inventors: Cindy Seibel, Cameron Park, CA (US); Somit Talwar, Los Gatos, CA (US)

(73) Assignee: Ultratech Stepper, Inc., San Jose, CA (US)

( * ) Notice: Subject to any disclaimer, the term of this patent is extended or adjusted under 35 U.S.C. 154(b) by 0 days.

(21) Appl. No.: 09/941,817

(22) Filed: Aug. 29, 2001

(65) Prior Publication Data

US 2003/0045074 A1 Mar. 6, 2003

(51) Int. Cl.⁷ .................. H01L 21/336; H01L 21/20; H01L 21/425; H01L 21/26
(52) U.S. Cl. .................. 438/486; 438/308; 438/482; 438/487; 438/517; 438/798
(58) Field of Search ................ 438/299, 308, 438/530, 533, 655, 301, 303, 305, 306, 486, 487

(56) References Cited

U.S. PATENT DOCUMENTS

| | | | | |
|---|---|---|---|---|
| 5,966,605 A | * | 10/1999 | Ishida | 438/299 |
| 6,077,758 A | * | 6/2000 | Zhang et al. | 438/149 |
| 6,159,782 A | * | 12/2000 | Xiang et al. | 438/197 |
| 6,165,875 A | * | 12/2000 | Fonash et al. | 438/486 |
| 6,274,488 B1 | * | 8/2001 | Talwar et al. | 438/301 |
| 6,312,998 B1 | * | 11/2001 | Yu | 438/303 |
| 6,365,476 B1 | * | 4/2002 | Talwar et al. | 438/301 |
| 6,387,784 B1 | * | 5/2002 | Chong et al. | 438/585 |
| 6,391,731 B1 | * | 5/2002 | Chong et al. | 438/303 |
| 6,451,644 B1 | * | 9/2002 | Yu | 438/230 |
| 6,475,872 B1 | * | 11/2002 | Jung | 438/384 |

OTHER PUBLICATIONS

Van Zant, Peter; Microchip Fabrication 2000; McGraw–Hill, Fourth Edition; pp. 331, 403–404, and 411–412.*
Somit Talwar, Gaurav Verma, Kurt Weiner, *Ultra–Shallow, Abrupt, and Highly–Activated Junctions by Low–Energy Ion Implantation and Laser Annealing*, IEEE, 1999, pp. 1171–1174.
P.S. Peercy, J. Y. Tsao, S. R. Stiffler and Michael O. Thompson, *Explosive Crystallization in Amorphous Si Initiated by Long Pulse Width Laser Irradiation*, Appl. Phys. Lett. 52 (3), Jan. 18, 1988, pp. 203–205.

* cited by examiner

*Primary Examiner*—Carl Whitehead, Jr.
*Assistant Examiner*—David L. Hogans
(74) *Attorney, Agent, or Firm*—Allston L. Jones (57) ABSTRACT

A method of forming a doped polycrystalline silicon gate in a Metal Oxide Semiconductor (MOS) device. The method includes forming first an insulation layer on a top surface of a crystalline silicon substrate. Next, an amorphous silicon layer is formed on top of and in contact with the insulation layer and then a dopant is introduced in a top surface layer of the amorphous silicon layer. The top surface of the amorphous silicon layer is irradiated with a laser beam and the heat of the radiation causes the top surface layer to melt and initiates explosive recrystallization (XRC) of the amorphous silicon layer. The XRC process transforms the amorphous silicon layer into a polycrystalline silicon gate and distributes the dopant homogeneously throughout the polycrystalline gate.

23 Claims, 8 Drawing Sheets

METHOD FOR SEMICONDUCTOR GATE DOPING

BACKGROUND OF THE INVENTION

1. Field of the Invention

The present invention relates to semiconductor gate doping, and more particularly to a laser thermal processing method for gate doping in semiconductor devices.

2. Description of the Prior Art

Improvements in semiconductor technology and semiconductor manufacturing are the main drivers to the reduction of cost and the increase in speed of computers. There have been many improvements of semiconductor devices to increase their speed and performance, ranging from packaging of integrated circuits ("chips") to the wiring of the devices on the chip, to the design of the devices themselves.

Another main driver in semiconductor technology is the trend toward smaller device structures. Metal oxide semiconductor field effect transistors (MOSFET) with submicron gate dimensions of the order of 100 to 250 nm are being developed. Performance improvements for these small gate dimension devices are generally obtained by changing the physical structure and materials used in the device and by inventing new processes or improving an existing process for making the devices.

Figure 1:
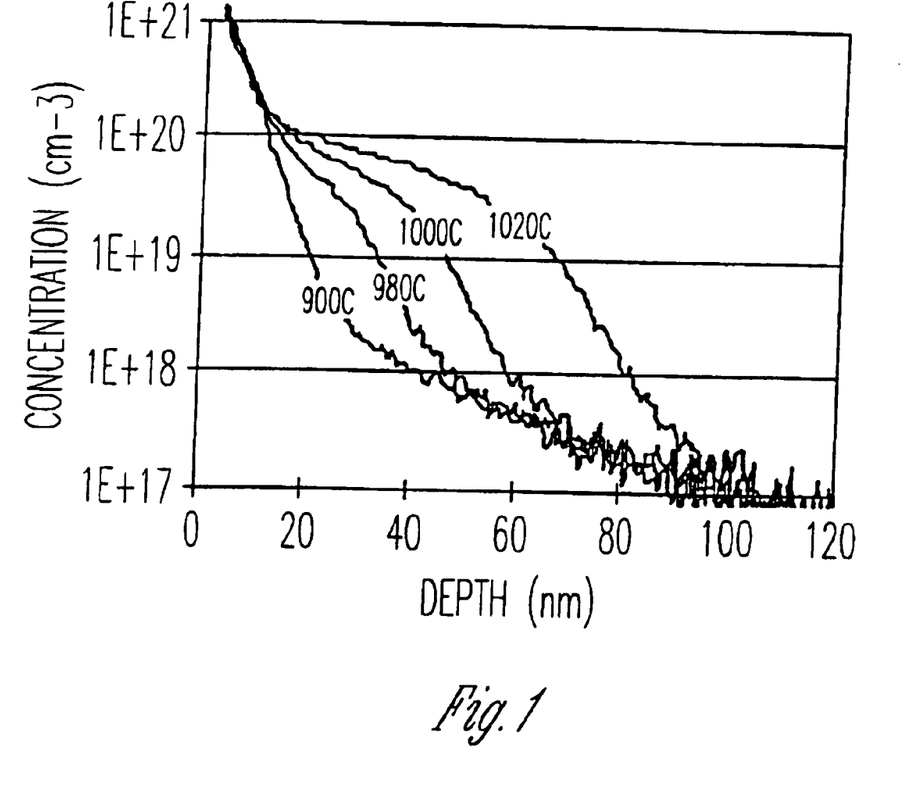
FIG. 1 depicts secondary ion mass spectroscopy (SIMS) profiles of boron in polycrystalline silicon for conventional thermal annealing.

For example, a method for doping of polycrystalline silicon gates includes a low energy ion implantation of a dopant followed by a thermal anneal for activation of the dopant. Examples of dopants used in polycrystalline silicon gates include boron, $BF_2+$, arsenic and phosphorus, among others. Referring to FIG. 1, boron dopant profiles in silicon produced by conventional thermal annealing processes exhibit a gradual drop, spread out over a broad depth range. In the examples shown in FIG. 1 this range is about 100 nm, which is comparable to the submicron gate dimensions of 100 to 250 nanometers.

The nature of the dopant profiles and the dopant concentration affect the performance of the chip. A junction with a gradual dopant profile is prone to sub-threshold leakage, while a reduced dopant concentration can result in a source or drain with a higher sheet resistance than is desired. The formation of abrupt junctions (e.g., sharp dopant profiles) reduces overlap capacitance and spreading resistance, and the ability to increase the dopant concentration lowers the sheet resistance. Both these effects serve to increase the speed and improve the performance of the chip.

Among the problems that occur with annealing of shallow polycrystalline silicon gates are gate depletion (i.e., low dopant concentration), inhomogeneous distribution and dopant diffusion through the thin insulating gate oxide (gate leakage). Gate depletion results when low annealing temperatures are used to avoid dopant diffusion through the thin insulating gate oxide. Low dopant concentration results in performance loss for the device. Full dopant activation and distribution is accomplished by high temperature annealing. However, the diffusion coefficient of dopants is higher along the grain boundaries than within the crystalline grains of the poly crystalline silicon gates resulting in inhomogeneous dopant distribution and dopant penetration through the insulating gate oxide which then leads in high leakage currents and poor device performance.

It is desirable to develop a thermal annealing process for doping and activating polycrystalline silicon gates that avoids gate depletion, leakage currents and results in improved device performance.

SUMMARY OF THE INVENTION

In general, in one aspect, the invention provides a method of forming a doped polycrystalline silicon gate in a Metal Oxide Semiconductor (MOS) device formed on a top surface of a crystalline silicon substrate. The method includes forming first an insulation layer on the top surface of the silicon substrate and then an amorphous silicon layer on top of and in contact with the insulation layer. A dopant is then introduced in a top surface layer of the amorphous silicon and the top surface layer of the amorphous silicon is then irradiated with a radiation beam. The radiation beam heats the top surface layer of the amorphous silicon and causes melting and explosive recrystallization (XRC) of the amorphous silicon layer. The XRC transforms the amorphous silicon layer into a polycrystalline silicon gate and distributes the dopant uniformly throughout the polycrystalline gate.

Implementations of the invention may include one or more of the following features. The dopant may be introduced in the top layer of the amorphous silicon layer by ion implantation. The radiation beam may be a laser beam. The laser beam may be a pulsed laser having a wavelength of between 0.1 and 2.0 microns, a temporal pulse width of less than 1 ms, and an irradiance between 0.1 and 1000 $J/cm^2$ per pulse. The laser beam may have between 3 and 10 pulses at a repetition rate between 200 and 400 Hz. Following the XRC process a metal contact may be formed atop the polycrystalline gate. The metal contact may include at least one of tungsten, tungsten silicide, tungsten nitride, tantalum, tantalum nitride, titanium, titanium nitride and platinum. The insulation layer may include silicon dioxide. The dopant may include at least one of boron, $BF_2+$, arsenic, and phosphorus. The polycrystalline gate may have a height of less than 500 nanometers.

In general, in another aspect, the invention features an alternative method of forming a doped polycrystalline silicon gate in a Metal Oxide Semiconductor (MOS) device formed on a top surface of a crystalline silicon substrate. The method includes forming first an insulation layer on the top surface of the silicon substrate and then an amorphous silicon layer on top of and in contact with the insulation layer. A dopant layer is then formed on top of and in contact with the amorphous silicon layer and the top surface layer of the amorphous silicon is then irradiated with a radiation beam. The radiation beam heats and melts the dopant layer and the top surface layer of the amorphous silicon and causes diffusion of the dopant in the top surface layer of the amorphous silicon layer and explosive recrystallization (XRC) of the amorphous silicon layer. The XRC transforms the amorphous silicon layer into a polycrystalline silicon gate and distributes the dopant uniformly throughout the polycrystalline gate.

Implementations of the invention may include one or more of the following features. The dopant may be deposited via sputtering, evaporation or chemical vapor deposition. The radiation beam may be a laser beam. The laser beam may be a pulsed laser having a wavelength of between 0.1 and 2.0 microns, a temporal pulse width of less than 1 ms, and an irradiance between 0.1 and 1000 $J/cm^2$ per pulse. The laser beam may have between 3 and 10 pulses at a repetition rate between 200 and 400 Hz. Following the XRC process a metal contact may be formed atop the polycrystalline gate. The metal contact may include at least one of tungsten, tungsten suicide, tungsten nitride, tantalum, tantalum nitride, titanium, titanium nitride and platinum. The insulation layer may include silicon dioxide. The dopant may include at least one of boron, $BF_2+$, arsenic, phosphorus. The polycrystalline gate may have a height of less than 500 nanometers. The dopants may be incorporated at concentrations of $3 \times 10^{20}$ ions/cm$^3$, $5 \times 10^{20}$ ions/cm$^3$ and $1 \times 10^{21}$ ions/cm$^3$ for boron, arsenic and phosphorus, respectively.

Among the advantages of this invention may be one or more of the following. The small thermal budget and short process time utilized by the laser induced XRC process produces a fine microcrystalline grain structure in the silicon gate with evenly distributed dopants within the crystalline grains and the grain boundaries. The process is readily integrated into existing CMOS processing technology and improves device performance by producing polycrystalline silicon gates without gate depletion or gate leakage effects.

The details of one or more embodiments of the invention are set forth in the accompanying drawings and description below. Other features, objects and advantages of the invention will be apparent from the following description of the preferred embodiments, the drawings and from the claims.

DETAILED DESCRIPTION OF THE INVENTION

Figure 2A:
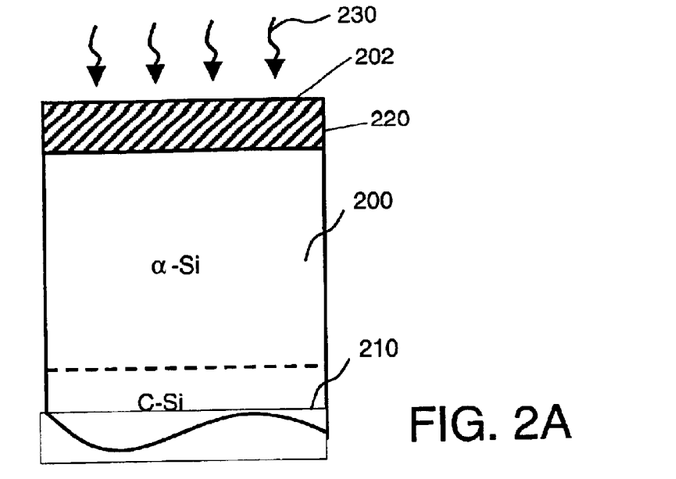
FIG. 2A is a cross-sectional schematic diagram depicting laser irradiation of an amorphous silicon layer formed on top of a crystalline silicon substrate.

Referring to FIG. 2A, an amorphous silicon (a-Si) layer 200 is formed on top of a crystalline silicon substrate (c-Si) 210. Laser beam 230 irradiates the top surface 202 of the amorphous silicon layer 200. Laser beam 230 is pulsed radiation generated by a Neodymium YAG laser and has wavelength of 532 nanometers. The heat from the laser beam 230 melts a first thin layer 220 of the amorphous silicon 200 near the top surface 202. In one example the energy fluence is 0.4 1 J/cm$^2$ and is delivered in a series of 3 to 10 pulses having temporal width of 16 nanoseconds at a repetition rate preferably between 3 Hz and 10 Hz. Between pulses of the laser beam 230, the molten layer 220 is allowed to cool to room temperature causing explosive recrystallization (XRC) of the amorphous silicon 200. XRC is well known in the art and is described in U.S. Pat. No. 6,274,488 and in a published paper "Explosive Crystallization in Amorphous Si Initiated by Long Pulse Width Laser Irradiation", P. S. Peercy, J. Y. Tsao, S. R. Stiffler and Michael O. Thompson, Appl. Phys. Lett. 54 (3), Jan. 18, 1988.

Figure 2B:
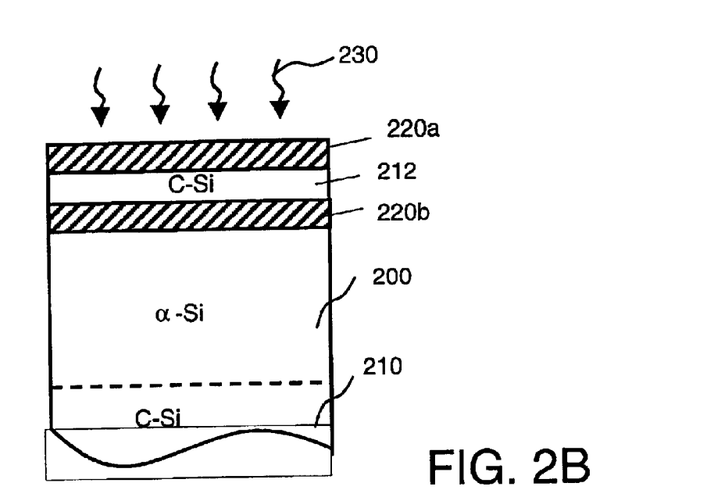
FIG. 2B is a cross-sectional schematic diagram depicting the onset of explosive recrystallization (XRC) of the amorphous silicon of FIG. 2A.

Referring to FIG. 2B, explosive recrystallization occurs when the molten layer 220 is allowed to cool and recrystallize thus forming a polycrystalline silicon layer 212. During the recrystallization process latent crystallization heat is released, which is transferred to the amorphous silicon layers above 220a and below 220b the crystallized layer 212 causing them to melt. In this way, XRC causes the molten layer 220 to split into an outer molten layer 220a on top of crystallized layer 212 and an inner molten layer 220b below the polycrystalline layer 212. While the outer molten layer 220a returns to the top surface 202, the inner molten layer 220b below the polycrystalline layer 212 propagates to the interior of the amorphous silicon 200 continuing to leave behind a polycrystalline silicon layer 212 while maintaining a liquid front I1 (shown in FIG. 2C). The XRC process terminates when the released crystallization heat becomes smaller than the heat needed to melt the amorphous silicon below it or until a material interface is encountered, i.e., the interface I2 (shown in FIG. 2C) between the amorphous silicon 200 and the crystalline silicon substrate 210.

Figure 2C:
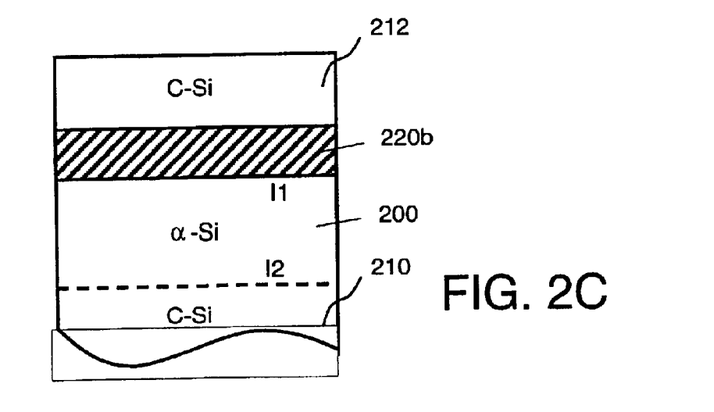
FIG. 2C is a cross-sectional schematic diagram depicting the propagation of a buried molten layer in the amorphous silicon of FIG. 2B.

The time interval over which the XRC takes place is about 50 nanoseconds during which the liquid front I1 travels with a velocity between 5 and 15 m/sec.

The temperature sufficient to initiate XRC is in the range between about 1150° C. and 1410° C. The upper bound on the temperature range is determined by the melting temperature of crystalline Si and the lower bound is the melting temperature of amorphous silicon. Because amorphous silicon is metastable, it melts and re-crystallizes at a lower temperatures than crystalline Si which is more atomically ordered. As described above, upon XRC, the heat that builds up at interface I1 propagates toward interface I2 as amorphous layer 200 re-crystallizes.

The irradiation of the amorphous silicon layer 200 is preferably performed in a chamber with an inert atmosphere of nitrogen, argon or helium. A suitable chamber is the P-GILA™ machine commercially available from Ultratech Stepper, Inc., San Jose, Calif.

Figure 3:
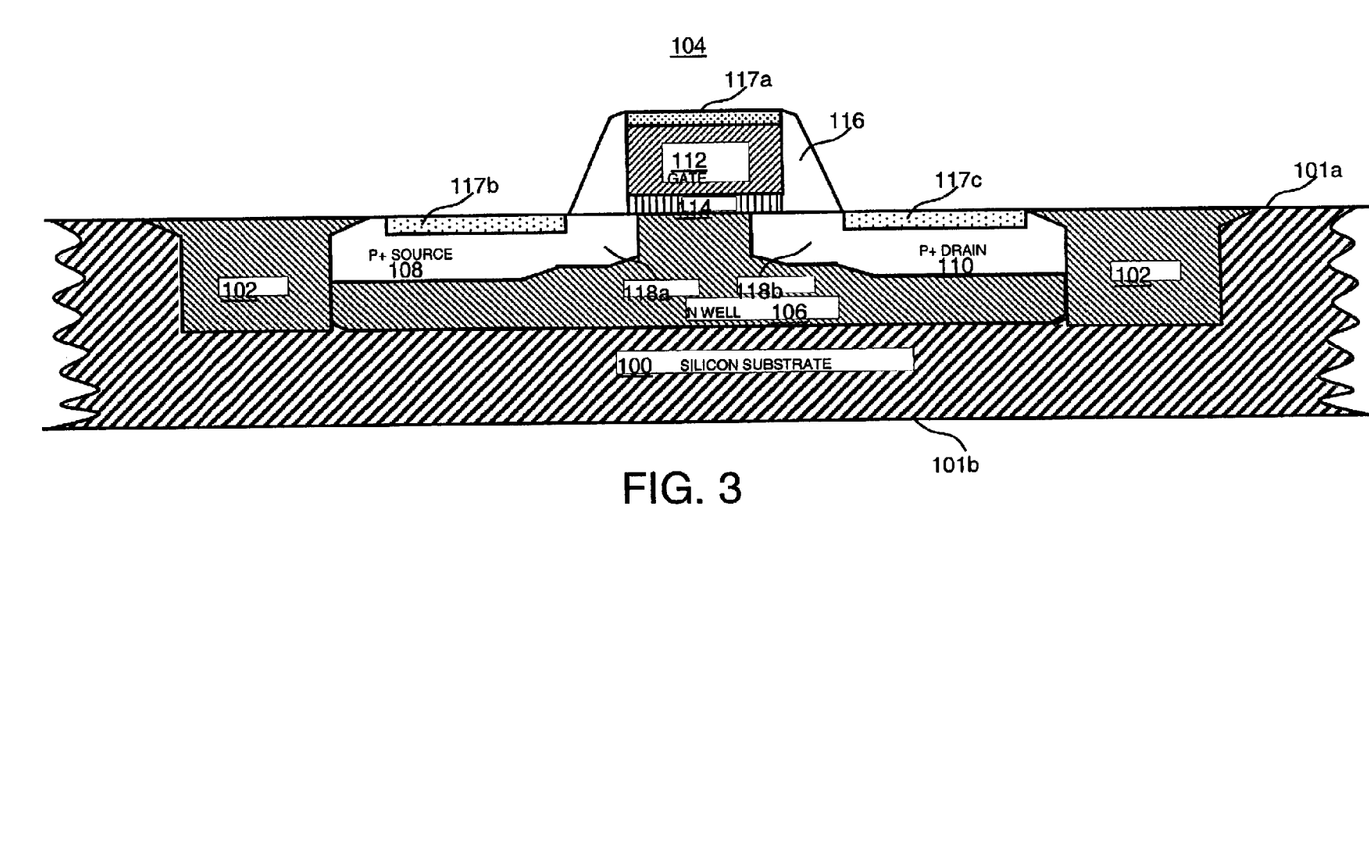
FIG. 3 is a schematic diagram of a metal oxide semiconductor field effect transistor (MOSFET)

Referring to FIG. 3, the above described XRC process is used to form and dope a poly-silicon gate 112 of a metal oxide semiconductor field effect transistor (MOSFET) 104. MOSFET 104 is formed on a silicon substrate 100 and is isolated from other devices that may be also formed on the silicon substrate 100 by isolation elements 102. MOSFET 104 includes in addition to gate 112, an N well 106, a P+ source 108 and a P+ drain 110. Gate 112 is formed on the top surface 101a of the substrate 100 and is insulated from the well 106 by a gate insulation layer 114. Electrical contacts 117a, 117b and 117c are formed on top of the gate 112, the P+ source 108 and the P+ drain 110, respectively. Sidewall spacers 116 help achieve self-alignment of the position of the electrical contacts, and also prevent horizontal diffusion into gate 112. The P+ source 108 and P+ drain 110 couple to the channel region below the gate 112 via shallow extension junctions 118a and 118b, respectively.

In one example, the gate 112 has a height of approximately 200 nanometers, the gate insulation layer 114 has a height between 50 nanometers and 10 nanometers, the shallow extension junctions 118a and 118b have a depth of approximately 20 to 30 nanometers and the source and drain regions have a depth of 80 nanometers.

Figures 4A, 4B:
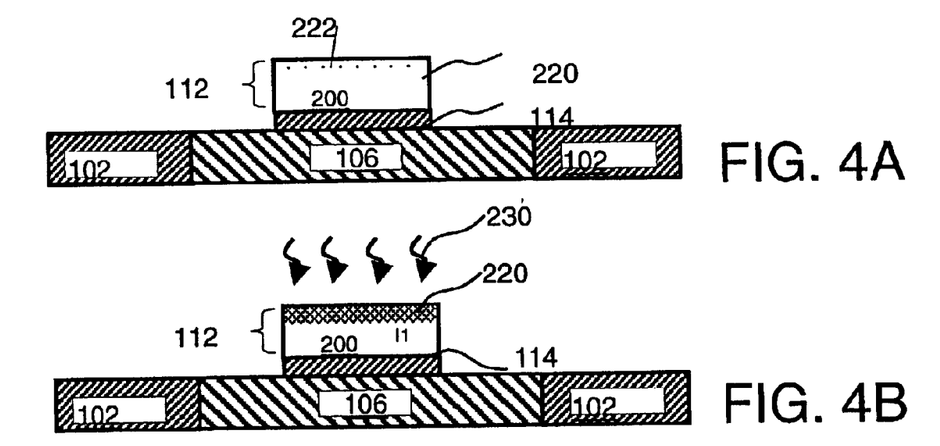
FIG. 4A is a cross-sectional schematic diagram of a silicon substrate having a doped amorphous silicon gate.
FIG. 4B is a cross-sectional schematic diagram depicting laser irradiation of the amorphous silicon gate of FIG. 4A.

Referring to FIG. 4A, a process of fabricating the MOSFET 104, described in FIG. 3, includes first forming spaced apart shallow isolation elements 102 to electrically isolate an area of the silicon substrate 100 in which the MOSFET device is to be formed. Isolation elements 102 are formed by first etching spaced apart trenches into top surface 101a of the silicon substrate 100 and then filling the trenches with an insulating material. In one example, the insulating material is an oxide such as silicon dioxide. The top surface 101a of the silicon substrate 100 is then chemical-mechanical polished, resulting in a planarized top surface.

After the formation of the isolation elements 102, a gate insulation layer 114 is formed on the top surface 101a of the silicon substrate 100 in an area between the isolation elements 102. On top of the gate insulation layer 114, a gate layer 112 is deposited. In one example, the gate insulation layer is $SiO_2$ and the gate layer 112 is amorphous silicon 200 deposited by low-pressure chemical vapor deposition (CVD). A dopant 222 is implanted on the top layer 220 of the amorphous silicon 200. In one example dopant 222 is boron implanted to a depth of 50 nm.

In accordance with the XRC process described above, and referring to FIG. 4B, a laser beam 230 irradiates the top surface 202 of the amorphous silicon (a-Si) 200 and the heat from the laser beam 230 melts top layer 220 and distributes dopant 222 in the molten silicon layer 220. Since the dopant diffusivity in liquid silicon is about 8 orders of magnitude higher than in solid silicon the dopant 222 is distributed almost uniformly in the molten silicon layer 220 and the diffusion stops exactly at the liquid/solid interface I1. Between pulses of the laser beam 230, the molten layer 220 is allowed to cool to room temperature and crystallize forming polycrystalline silicon 212 and a propagating molten layer 220b below the polycrystalline layer 212, shown in FIG. 4C. The propagating molten layer 220b transports the dopant 222 and as it solidifies a fraction of the dopant present in the molten layer is incorporated in the solidified polycrystalline layer 212. The fraction of dopant 222 that remains in the propagating molten layer 220b is driven along with the molten layer and distributed uniformly throughout the solidified layer.

Figures 4C, 4D:
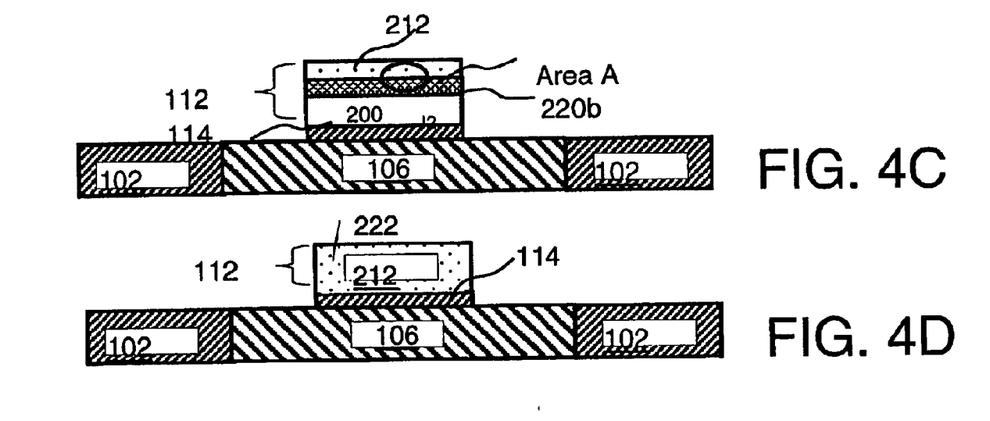
FIG. 4C is a cross-sectional schematic diagram depicting XRC of the amorphous silicon gate of FIG. 4B.
FIG. 4D is a cross-sectional schematic diagram depicting a doped polycrystalline silicon gate formed with the XRC process of FIG. 4C.
Figure 4E:
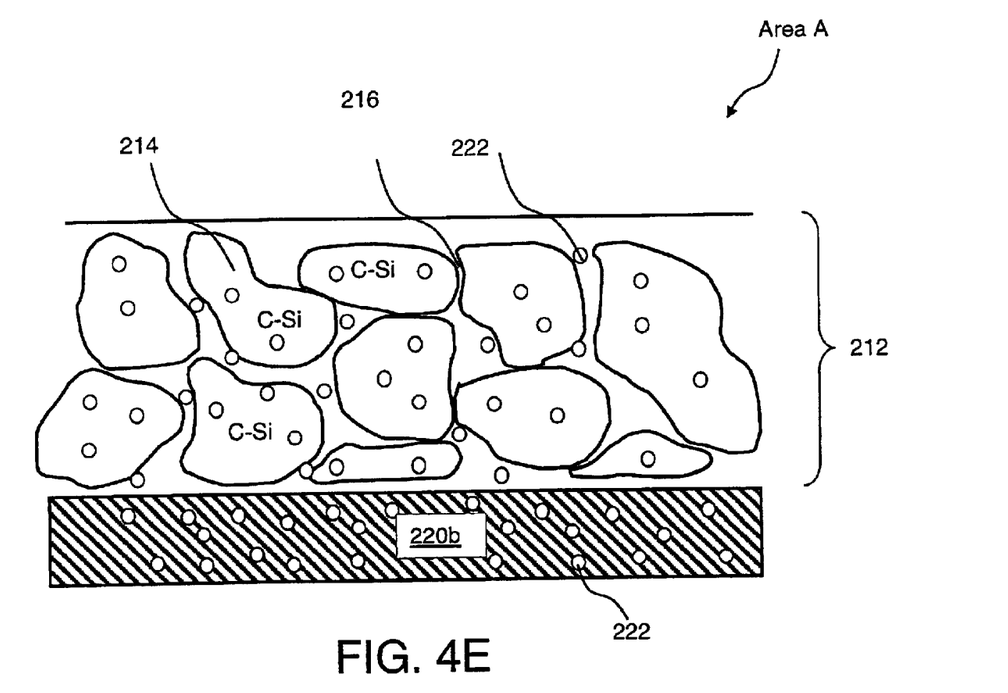
FIG. 4E is an enlarged cross-sectional schematic diagram of area A of FIG. 4C.

Referring to FIG. 4E, polycrystalline silicon layer 212 includes crystalline silicon grains 214 and dopant 222 distributed throughout the grains 214 and the grain boundaries 216. Since the concentration of dopant 222 is higher in the liquid than the solid phase the majority of the dopant 222 remains in the propagating molten layer 220b while a small portion is distributed in the polycrystalline layer 212.

This XRC process continues until the interface I2 between the amorphous silicon 200 and the gate insulator layer 114 is reached. Referring to FIG. 4D, when the XRC terminates amorphous silicon 200 is transformed into a polycrystalline silicon 212 with evenly distributed dopant 222 concentration. In one example the crystalline grains are in the range of between 20 and 30 Angstroms, the dopant concentration is for boron $3\times10^{20}$ ions/$cm^3$, for arsenic $5\times10^{20}$ ions/$cm^3$ and for phosphorus $1\times10^{21}$ ions/$cm^3$.

Laser beam 230 is a pulsed radiation generated by a Neodymium YAG laser and has a wavelength of 532 nanometers, a pulse width of 16 nanoseconds, repetition rate of between 3 Hz and 10 Hz and an energy fluence of 0.1 to 0.3 Joules/$cm^2$.

After the formation and doping of the polycrystalline layer 212, a low temperature anneal is performed to activate dopant 222. Following the activation annealing, layer 212 and gate insulator layer 114 are patterned using a resist layer to selectively form or etch the polycrystalline silicon gate and the insulator layer to form the gate body ("gate") 112. Following the gate formation, extension junctions 118a and 118b are formed below and adjacent either side of gate 112 followed by the formation and activation of the source 108 and drain 110 regions is well known in the art and described in U.S. Pat. No. 6,274,488. Finally, metal contacts 117a, 117b, 117c are deposited, as described in the above mentioned reference.

Figure 5A:
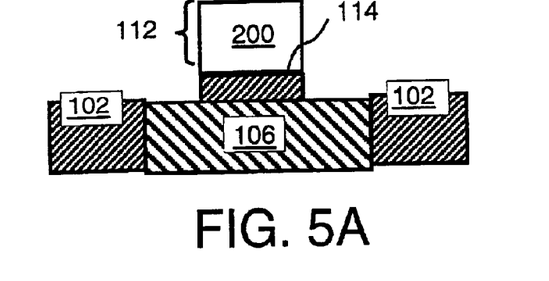
FIG. 5A is a cross-sectional schematic diagram of a silicon substrate having an amorphous silicon gate.
Figure 5B:
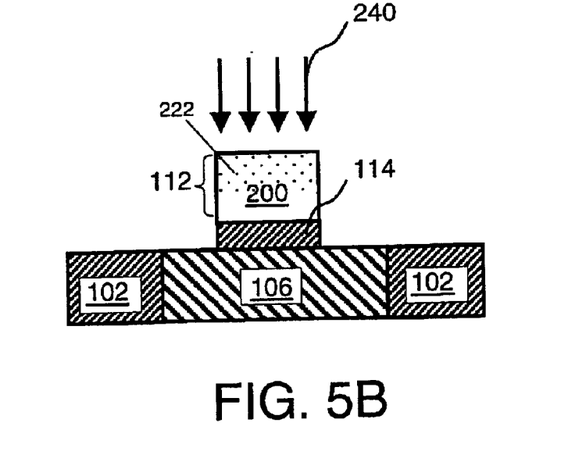
FIG. 5B is a cross-sectional schematic diagram depicting ion implantation doping of the amorphous silicon gate of FIG. 5A.

Referring to FIG. 5A, in another embodiment, gate 112 includes amorphous silicon 200 which is doped by ion implantation 240, shown in FIG. 5B. Dopant 222 is implanted in the top layer 220 of the amorphous silicon 200. In one example, an ion implantation beam having energy of between 200 eV to 400 KeV and a dose of $1\times10^{14}$ atoms/$cm^2$ to $1\times10^{16}$ atoms/$cm^2$ is used to implant dopant 222. Examples of dopants used in silicon gates include boron, $BF_2+$, arsenic and phosphorus, among others.

Figure 5C:
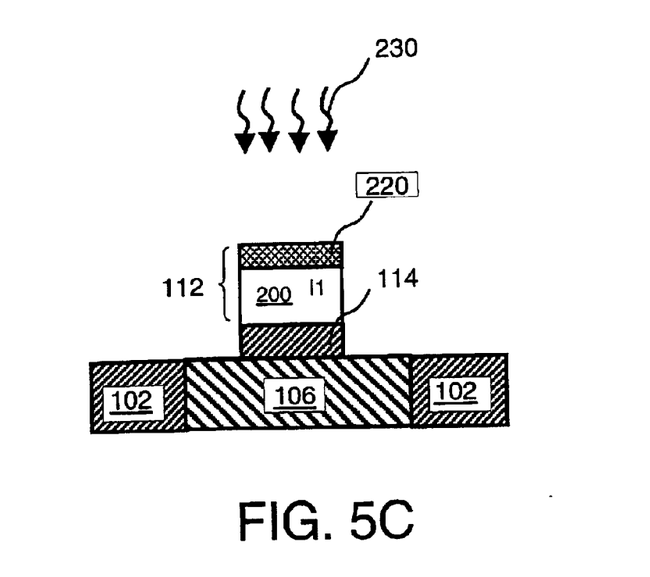
FIG. 5C is a cross-sectional schematic diagram depicting laser irradiation of the doped amorphous silicon gate of FIG. 5B.
Figure 5D:
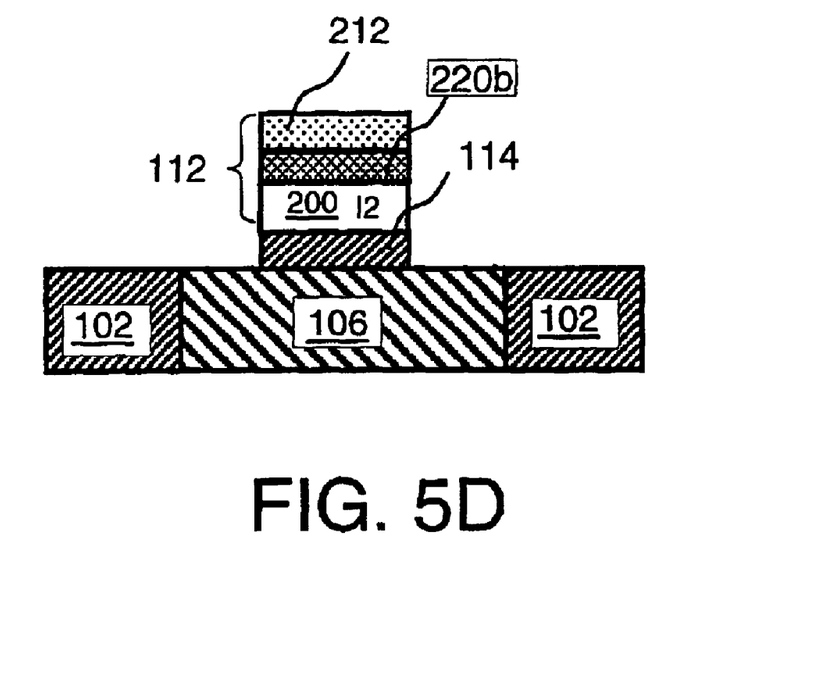
FIG. 5D is a cross-sectional schematic diagram depicting XRC of the amorphous silicon gate of FIG. 5C.
Figure 5E:
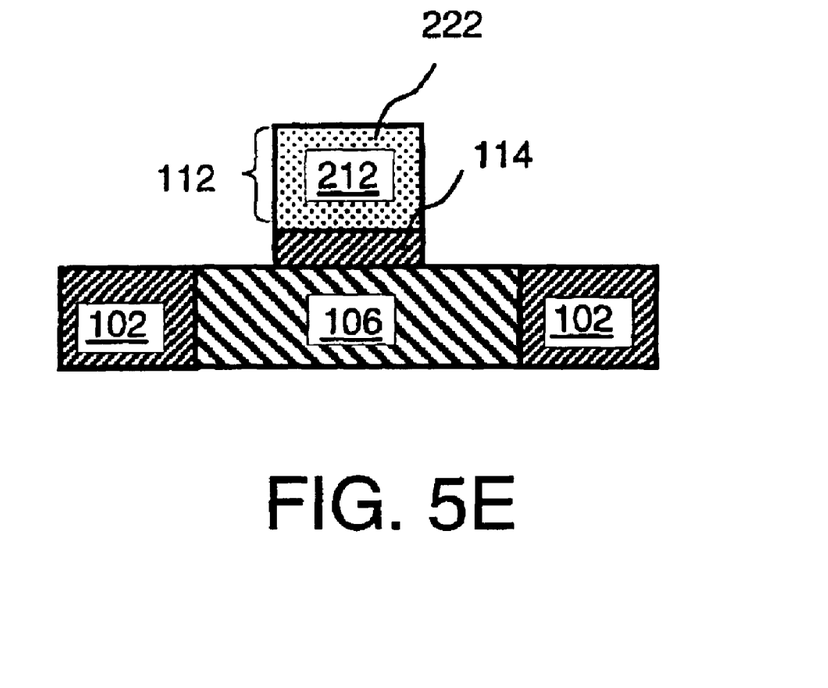
FIG. 5E is a cross-sectional schematic diagram depicting a doped polycrystalline silicon gate formed with the XRC process of FIG. 5D.

Following the ion implantation step, and referring to FIG. 5C, laser beam 230 melts the top layer 220 of the doped amorphous silicon 200. XRC causes the formation of a polycrystalline layer 212 and the propagation of the molten layer 220b, shown in FIG. 5D. The implanted dopants 222 segregate within the grain 214 and between the grain boundaries 216 of crystalline layer 212, while a large portion of them remain in the molten propagating layer 220b, as shown in FIG. 4E. This XRC process continues until the interface I2 between the amorphous silicon 200 and the gate insulator layer 114 is reached. Referring to FIG. 5E, when the XRC terminates amorphous silicon 200 is transformed into polycrystalline silicon 212 with evenly distributed dopant 222 concentration.

Figure 6:
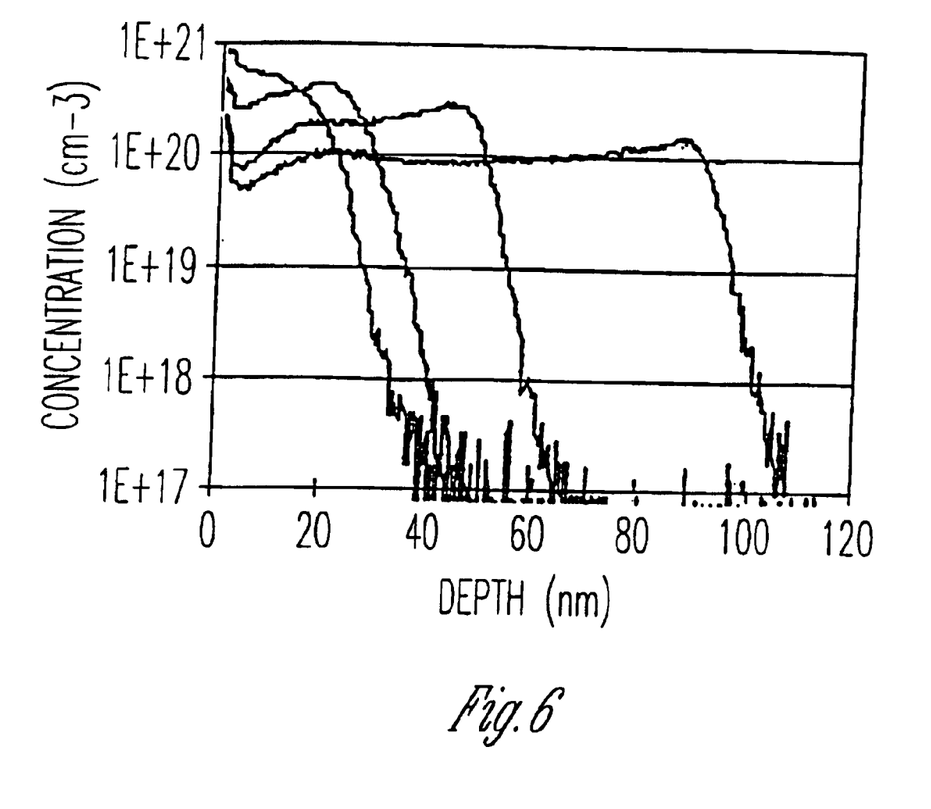
FIG. 6 depicts secondary ion mass spectroscopy (SIMS) profiles of boron in silicon for laser annealed amorphous silicon at different laser energy fluence.

Referring to FIG. 6 a secondary ion mass spectroscopy (SIMS) profile of boron distributed in silicon by laser annealing exhibits a constant boron concentration of approximately $1\times10^{20}$ ions/$cm^3$ up to 90 nm depth and then a sharp decline to zero over a range of 20 nm from 90 to 110 nm (curve 4). The laser energy fluence for curve 4 is 0.90 J/$cm^2$. Curves 1, 2 and 3 depict SIMS profiles for laser energy fluences of 0.55 J/$cm^2$, 0.60 J/$cm^2$ and 0.80 J/$cm^2$, respectively.

In alternative embodiments the laser beam is generated by a laser having a wavelength between 0.1 and 2 microns, a temporal pulse width between 1 and 100 nanoseconds, a repetition rate between 1 and 1000 Hz and radiation energy fluence between 0.1 and 10 J/$cm^2$. In one example the energy fluence is 0.4 J/$cm^2$ and is delivered in a series of 3 to 10 pulses of 10 to 100 nanoseconds at a repetition rate preferably between 200 Hz and 400 Hz. The exact laser fluence, number of pulses, pulse duration and repetition rate needed to operate within the process margin of the method of the present invention will vary between the different kinds of radiation sources (e.g., lasers) and the amorphous silicon layer 200 thickness. Accordingly, like most semiconductor processes, these parameters may need to be determined empirically. Examples of lasers include excimer lasers, including an ArF laser having a wavelength of 193 nm, KrF laser having a wavelength of 248 nm, XeF with a wavelength of 351 nm and a XeCl with a wavelength of 308 nm and solid state lasers such as ND-YAG lasers at 1064 nm, frequency doubled Nd-YAG lasers at 532 nm, AlGaAs diode lasers at about 800 nm and Ti-saphire lasers at about 800 nm. Dopant 222 may be any other P-type dopant including boron, aluminum, gallium and indium, or N-type dopant including arsenic, phosphorous and antimony.

Among the advantages of the invention are the following. The small thermal budget and short process time utilized by the laser induced XRC process produces a fine microcrystalline grain structure in the silicon gate with evenly distributed dopants within the crystalline grains and the grain boundaries. The etch rate of polycrystalline silicon depends upon the concentration of the active dopants. Since the dopants after the XRC are not yet activated and evenly distributed simultaneous etching of both N and P type gates will have the same etching rate for both N and P type gates leading to a dose independent etch rate. The dopants can be activated subsequent to the gate etching using a low temperature anneal. The process is readily integrated into existing CMOS processing technology and improves device performance by producing polycrystalline silicon gates without gate depletion or gate leakage effects.

The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and operation described herein. Accordingly, other embodiments are within the scope of the following claims.

What is claimed is:

1. A method of forming a doped polycrystalline silicon gate in a Metal Oxide Semiconductor CMOS) device formed on a top surface of a crystalline silicon substrate comprising:
    a) forming an insulation layer on said top surface the silicon substrate;
    b) forming an amorphous silicon layer on top of and in contact with said insulation layer;
    c) introducing a dopant in a top surface of said amorphous silicon layer; and
    d) irradiating said top surface of said amorphous silicon layer with a radiation beam to heat said top surface to a temperature between 1150° C. and the melting temperature of said silicon substrate to initiate explosive recrystallization of said amorphous silicon layer from said top surface to the contact with said insulation layer to transform said amorphous silicon layer into a polycrystalline silicon gate with said dopant distributed uniformly throughout said polycrystalline gate.

2. The method of claim 1 wherein said dopant is introduced in the top surface of the amorphous silicon layer by ion implantation.

3. The method of claim 1 wherein said radiation beam is a laser beam.

4. The method of claim 3 wherein said laser beam is a pulsed laser having a wavelength of between 0.1 and 2.0 microns, a temporal pulse width of less than 1 ms, and an irradiance between 0.1 and 1000 J/cm² per pulse.

5. The method of claim 4 wherein said laser beam comprises between 3 and 10 pulses at a repetition rate between 200 and 400 Hz.

6. The method of claim 1 further comprising after step d) depositing a metal contact atop said polycrystalline gate.

7. The method of claim 6 wherein said metal contact comprises at least one of tungsten, tungsten suicide, tungsten nitride, tantalum, tantalum nitride, titanium, titanium nitride and platinum.

8. The method of claim 1 wherein said insulation layer comprises silicon dioxide.

9. The method of claim 1 wherein said dopant comprises at least one of boron, $BF_2+$, indium, arsenic, phosphorus and antimony.

10. The method of claim 1 wherein said polycrystalline gate has a height of less than 500 nanometers.

11. A method of forming a doped polycrystalline silicon gate in a Metal Oxide Semiconductor (MOS) device formed on a top surface of a crystalline silicon substrate comprising:
    a) forming an insulation layer on said top surface of the silicon substrate;
    b) forming an amorphous silicon layer on top of and in contact with said insulation layer;
    c) forming a dopant layer on top of and in contact with said amorphous silicon layer; and
    d) irradiating said amorphous silicon layer with a radiation beam to heat said top surface to a temperature between 1150° C. and the melting temperature of said silicon substrate and melt said dopant layer and a top surface layer of said amorphous silicon layer to cause diffusion of said dopant into said to surface layer of said amorphous silicon layer and explosive recrystallization of said amorphous silicon layer from said top surface to the contact with said insulation layer to transform said amorphous layer into a polycrystalline silicon gate with said dopant distributed uniformly throughout said polycrystalline gate.

12. The method of claim 11 wherein said dopant layer is formed via sputtering.

13. The method of claim 11 wherein said dopant layer is formed via chemical vapor deposition.

14. The method of claim 11 wherein said dopant layer is formed via evaporation.

15. The method of claim 11 wherein said radiation beam is a laser beam.

16. The method of claim 15 wherein said laser beam is a pulsed laser having a wavelength of between 0.1 and 2.0 microns, a temporal pulse width of less than 1 ms, and an irradiance between 0.1 and 1000 J/cm² per pulse.

17. The method of claim 16 wherein said laser beam comprises between 3 and 10 pulses at a repetition rate between 200 and 400 Hz.

18. The method of claim 11 further comprising after step d) depositing a metal contact atop said polycrystalline gate.

19. The method of claim 18 wherein said metal contact comprises at least one of tungsten, tungsten silicide, tungsten nitride, tantalum, tantalum nitride, titanium, titanium nitride and platinum.

20. The method of claim 11 wherein said insulation layer comprises silicon dioxide.

21. The method of claim 11 wherein said dopant comprises at least one of boron, $BF_2+$, indium arsenic, phosphorus and antimony.

22. The method of claim 11 wherein said polycrystalline gate has a height of less than 500 nanometers.

23. The method of claim 11 wherein said dopant comprises at least one of boron, arsenic, phosphorus at concentrations of up to $3 \times 10^{20}$ ions/cm³, $5 \times 10^{20}$ ions/cm³, and $1 \times 10^{21}$ ions/cm³, respectively.

* * * * *